United States Patent [19]

Noonan et al.

[11] Patent Number: 4,696,990

[45] Date of Patent: Sep. 29, 1987

[54] NOVEL PHOTOCROSSLINKABLE LIQUID CRYSTALLINE POLYMERS

[75] Inventors: John M. Noonan; Anthony F. Caccamo, both of Rochester, N.Y.

[73] Assignee: Eastman Kodak Company, Rochester, N.Y.

[21] Appl. No.: 846,416

[22] Filed: Mar. 31, 1986

[51] Int. Cl.[4] ............................................. C08F 20/30
[52] U.S. Cl. ............................. 526/304; 252/299.01; 526/312; 526/313; 526/323.1
[58] Field of Search ............... 526/304, 311, 312, 313, 526/323.1; 252/299.01

[56] References Cited

U.S. PATENT DOCUMENTS

| | | | |
|---|---|---|---|
| 3,817,876 | 6/1974 | Fukotani et al. | 260/2 A |
| 3,826,784 | 7/1974 | Satomura | 526/271 |
| 3,933,746 | 1/1976 | Steele | 428/480 |
| 3,933,885 | 1/1976 | Satomura | 526/312 |
| 4,297,470 | 10/1981 | Osada | 526/304 |
| 4,434,262 | 2/1984 | Buckley | 524/290 |

Primary Examiner—Paul R. Michl
Attorney, Agent, or Firm—John R. Everett

[57] ABSTRACT

A photocrosslinkable liquid crystalline polymer comprising a vinyl backbone having from 60 to 100 mole percent of recurring pendant groups comprising an alkyl or alkoxy light-sensitive cinnamate component connected to the vinyl backbone through (a) a component which provides stiffness and rod-like character to the cinnamate component and (b) a spacer group having from 7 to 14 atoms.

7 Claims, No Drawings

NOVEL PHOTOCROSSLINKABLE LIQUID CRYSTALLINE POLYMERS

FIELD OF THE INVENTION

The present invention relates to novel photocrosslinkable liquid crystalline polymers and a method for their preparation and an imaging element using the polymers.

BACKGROUND OF THE INVENTION

Photocrosslinkable polymers are known. They have found many applications in industry. For example, photocrosslinkable polymers find many applications in the making of lithographic plates and in photoresist applications. Many of the more useful photocrosslinkable polymers comprise, as a light-sensitive component, recurring cinnamate components. For example, polyvinyl cinnamate is formed by reacting polyvinyl alcohol with cinnamic acid. Such polymers are disclosed in U.S. Pat. No. 3,817,876, U.S. Pat. No. 4,230,817 and U.S. Pat. No. 3,933,746.

In photolithographic and in photoresist applications, photocrosslinkable polymeric compositions are coated upon a suitable supporting surface such as a metal plate to form an imaging element. Thereafter, the element is exposed to actinic light. Exposure results in insolubilization of the polymer in the exposed areas and solubilization of the polymer in the unexposed areas. The unexposed areas of the polymer coating can be removed by means of suitable solvents to leave a relief image.

The photosensitized crosslinking of amorphous polymers such as those described in the above-mentioned U.S. patents generally show quantum yields of dimerization of about 4 percent. Sensitization of such polymers by ketocoumarins proceeds generally by triplet-triplet energy transfer. There are known to be several energy wastage steps competing with triplet-triplet energy transfer. In the case of amorphous cinnamate polymers, the triplet energy migrates step-wise from one cinnamate component to the next until it decays, or reaches an appropriate site for promoting crosslinking. An appropriate site in this regard is a double bond of the cinnamate components aligned parallel to each other, and approximately 4 angstroms apart. The triplet energy visits an average of 100 to 200 sites before an appropriate site is found. Since the lifetime of the triplet excited state is only 10 nanoseconds, the decay to the ground state dominates over excimer formation which results in crosslinking.

It would be extremely important and useful to design polymers which would make better use of triplet-triplet energy transfer which occurs with ketocoumarin sensitization.

SUMMARY OF THE INVENTION

The present invention provides a photocrosslinkable liquid crystalline polymer comprising a vinyl backbone having from 60 to 100 mole percent of recurring pendant groups comprising an alkyl or alkoxy substituted light-sensitive cinnamate component connected to the vinyl backbone through:

(a) a component which provides stiffness and rod-like character to the cinnamate component; and (b) a spacer group having the backbone of from 7 to 14 atoms.

The spacer group is an alkylene group that includes up to four groups selected from ethers $-\text{O}-$, esters $-\overset{\overset{\displaystyle O}{\|}}{\text{C}}-\text{O}-$, carbonates $-\text{OCO}-$ and amides $-\overset{\overset{\displaystyle O}{\|}}{\text{C}}-\text{NH}-$.

Examples of the latter groups include $-(\text{CH}_2\text{CH}_2\text{O})_x\text{CH}_2\text{CH}_2-$ wherein x is 1 to 4, $$-\text{CH}_2\text{CH}_2\text{CH}_2\text{CH}_2\text{O}-\overset{\overset{\displaystyle O}{\|}}{\text{C}}-\text{CH}_2\text{CH}_2-,$$

$$-\text{CH}_2-\text{CH}_2-\text{NH}\overset{\overset{\displaystyle O}{\|}}{\text{C}}-\text{CH}_2\text{CH}_2-,$$

$$-\text{CH}_2\text{CH}_2\text{CH}_2-\overset{\overset{\displaystyle O}{\|}}{\text{C}}-\text{NHCH}_2\text{CH}_2-,$$

etc.

The photocrosslinkable liquid crystalline polymers of the present invention achieve a 40 percent quantum yield of dimerization resulting in as much as an 9× increase in photographic speed of the polymers of the present invention compared to the poly(vinyl alcohol-co-vinyl-cinnamate) polymers of the prior art of similar molecular weight. In addition, higher molecular weight liquid crystalline polymers of the present invention achieve an 83× increase in photographic speed compared to a poly(vinyl alcohol-co-vinyl-cinnamate) control. Liquid crystalline polymers of the invention generally have an absolute molecular weight of 50,000 to 3,000,000.

Applicants have theorized that this dramatic increase in quantum yield of dimerization and resulting increase in photographic speed results from the more ordered character of liquid crystalline polymers compared to that of amorphous polymers. In the more ordered state of liquid crystalline polymers, the probability of the double bonds of the cinnamate components of the polymers being parallel to each other is significantly increased over the likelihood of such double bonds being parallel in an amorphous polymer.

In an especially useful embodiment of the invention, the photocrosslinkable liquid crystalline polymers of this invention have the structure

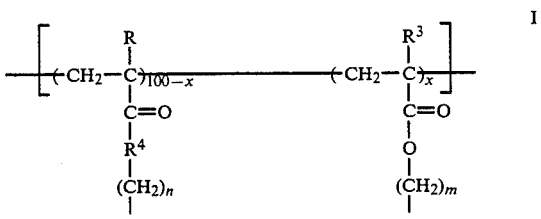

-continued

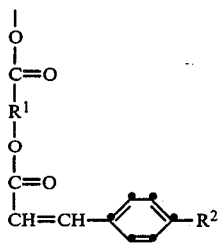

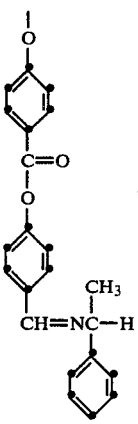

wherein
- n represents an integer of from 3 to 10;
- m represents an integer of from 2 to 6;
- x has a value of 0 to 35 mole percent;
- R and $R^3$, each independently represents hydrogen or methyl;
- $R^1$ represents phenylene, biphenylylene, terphenylylene, 1,1'-binaphthyl-4,4'-ylene, phenyleneoxycarbonylphenylene, azodiphenylene, azodiphenylene-N-oxide, naphthylene, stilbene-4,4'-diyl or α-azastilbene-4,4'-diyl;
- $R^2$ represents alkyl such as methyl, ethyl, propyl, butyl, 2-ethylhexyl and octyl, or alkoxy such as methoxy, ethoxy, propoxy, butoxy and octyloxy; and
- $R^4$ represents —O— or —NH—.

The groups included in $R^1$, are among groups known in the chemical literature to be stiff and rod-like.

In the above structure the spacer group is

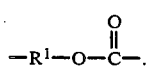

The group providing stiffness and rod-like character to the cinnamate group is $$-R^1-O-\overset{O}{\underset{\|}{C}}-.$$

DETAILS OF THE INVENTION

It is essential to the formation of liquid crystalline polymers of the invention that the spacer group and the group which provides stiffness and rod-like character to the cinnamate component be present.

The spacer group is necessary to decouple the motion of the polymer backbone from the motion of the cinnamate-containing side chains. Our experimental work has shown that the spacer group should comprise a backbone of from 7 to 14 atoms.

It is also important to achieve the liquid crystalline character of the polymers to provide a component attached to the cinnamate component which provides the cinnamate component with stiffness and rod-like character. Our experiments show that groups such as those mentioned as representative of $R^1$ in structure I satisfies this need. However, it would be clear to those skilled in the art that any group which provides the sufficient stiffness and rod-like character will work in achieving the liquid crystalline nature of the present polymers.

The concept of this invention applies to polymers comprising any kind of light-sensitive groups including photoconductive groups, photocross-linking groups, photopolymerizable groups, acid-photogenerating groups, etc.

The present invention also provides a method for making a photocrosslinkage liquid crystalline polymer comprising the steps of:

preparing an acrylate compound having the structure

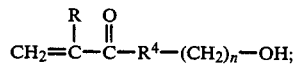

preparing a light-sensitive compound having the structure

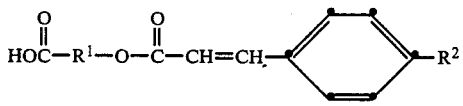

or its acid chloride;

reacting the acrylate compound and the light-sensitive compound together to form a monomer having the structure

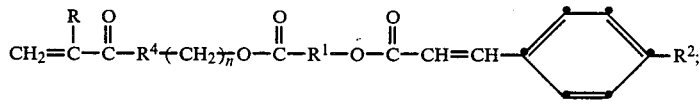

and polymerizing the monomer to form the light-sensitive acrylate liquid crystalline polymer; wherein R, $R^1$, $R^2$ and $R^4$ are as previously defined herein.

Polymers of this invention can be made from their corresponding methacrylate or acrylate monomers by solubilization in dichloroethane to a particular total solids concentration of 10–20%. Polymerization is then initiated with 1% 2,2'-azobis(2-methylpropionitrile) (AIBN) by weight, unless otherwise indicated. The solutions were placed in polymerization vials, sealed with inert caps and purged with $N_2$ for 20 minutes via syringe needles while cooling to eliminate evaporation. The flasks were then immersed in constant temperature baths at temperatures of about 50° to 90° C. for 15 hours. The resulting viscous solutions were diluted with dichloroethane and precipitated by adding the diluted solutions dropwise into ethyl ether with vigorous stirring. Solids were collected by vacuum filtration and dried at room temperature under oil pump vacuum.

The following preparative example illustrates the method in making polymer 1 of Table I, infra. The examples also illustrate standard techniques for preparing the monomers from which the polymers are ultimately made.

The group which provides stiffening and rod-like characteristics are added to the cinnamoyl component by reacting a compound, such as p-hydroxy benzoic acid, 4'-hydoxy-1-biphenylcarboxylic acid, 6-hydroxynaphthoic acid and 4-hydroxy-4'-stilbenecarboxylic acid with the cinnamoyl containing starting materials in the presence of base.

The spacer group is added to the group providing the stiffening and rod-like characteristics by reacting, as the spacer group, an acrylate or methacrylate compound, containing from 7 to 14 atoms. The acrylate or methacrylate compound includes the alkylene group that includes the ethers, carbonates, amides, etc., as defined hereinbefore, with the cinnamoyl having attached thereto the group providing stiffening and rod-like character. This latter step is carried out by contacting the cinnamoyl containing compound with the acrylate or methacrylate compound in the presence of dicyclohexylcarbodiimide and 4-pyrrolidinopyridine.

EXAMPLE 1

Preparation of Poly{6-[4-(4-Methoxycinnamoyloxy)benzoyloxy]hexyl Methacrylate}

Step 1

Preparation of 6-Hydroxyhexyl Methacrylate

Methacrylate acid (43.0 g=0.5 mole) was dissolved in 50 mL methanol. Tetrabutylammonium hydroxide (25% in methanol, 519 gm=0.5 mole) was added to the latter solution. The solution was stirred for 30 minutes, and then freed of solvent on a rotary evaporator. The residue was dissolved in 100 mL of N,N-dimethylformamide (DMF) and a solution of 6-chloro-1-hexanol (68.3 gm+0.5 mole) in 200 mL DMF was added. This was stirred at 50° C. for 4 hours, the heat was discontinued, and the solution was stirred at room temperature overnight. An equal volume of $H_2O$ was combined and the solution was extracted with three portions of ethyl acetate. The combined ethyl acetate layers were back-extracted with three portions of $H_2O$, dried over $MgSO_4$, and the mixture evaporated to an amber oil. $^1H$ NMR ($CDCl_3$): δ (ppm) 4.1 (2H, t). Elemental Analysis: $C_{10}H_{18}O_3$, mol. wt. 186. Calcd.: C, 61.5; H, 9.7; O, 25.8. Found: C, 61.7; H, 9.7.

Step 2

Preparation of 4-Methoxycinnamoyl Chloride p-Methoxycinnamic acid (52.7 g=0.45 mole) was slurried under $N_2$ in 500 mL of sieve-dried dichloroethane. Oxalyl chloride (146.0 gm=1.15 moles) was added in one portion followed by three drops of DMF. Complete solution was achieved in 30 minutes. The solution was stirred an additional 2 hours, and then the dichloroethane containing excess oxalyl chloride was removed on a 50° C. rotary evaporator. Fresh dichloroethane was twice added to the residue and removed on the rotary evaporator. The amber oil was used without purification. Yield 90.4 gm.

Step 3

Preparation of 4-(4-Methoxycinnamoyloxy)-Benzoic Acid

This step illustrates the addition of an aryl group to the compound of Step 2 to increase the stiffness and rod-like characteristics of the alkyl or alkoxy substituted cinnamoyl group. The compound of Step 2 (1.0 gm=5.1 mmole) was slurried under $N_2$ in 10 mL dry pyridine. N,N-diisopropylethylamine (0.7 gm=5.6 mmole) was added, followed by a spatula tip of 4-dimethylaminopyridine. A solution of p-hydroxybenzoic acid (0.7 gm, 5.1 mmole) in 7 mL pyridine was added dropwise to the above slurry. An amber-orange solution soon developed. The solution was stirred for 60 minutes after addition was complete, and it was dropped slowly into 200 ml ice/$H_2O$ containing 25 mL concentrated HCl. The resulting precipitate was collected by suction filtration, slurried twice with $H_2O$ on the funnel, and dried in a 40° C. vacuum oven. The white solid was recrystallized from boiling acetone. White needles, K280° l.c. Yield 0.6 gm. Elemental Analysis: $C_{17}H_{14}O_5$, mol. wt. 298.3. Calcd: C, 68.5, H, 4.7, O, 26.8. Found: C, 68.5, H, 4.7. $^1H$ NMR (DMSO-$d_6$): δ (ppm) 6.7 (1H, d), 8.0 (1H, d).

Step 4

Preparation of 6-[4-(4-Methoxycinnamoyloxy)benzoyloxy]hexyl Methyacrylate

This step involved adding a polymerizable group and the remainder of the spacer group to the compound of Step 3. The compound of Step 3 (25.5 g=85 mmole) was slurried in 800 mL dichloromethane. The compound of Step 1 (15.8 g=85 mmole) was added in one portion, followed by dicyclohexylcarbodiimide (17.5 g=85 mmole) and 4-pyrrolidinopyridine (1.3 g=8.5 mmole). The mixture was stirred at room temperature for 4 hours, and then vacuum filtered. The filtrate was washed with 5% aqueous acetic acid, $H_2O$, 3 portions 5% aqueous $Na_2CO_3$, $H_2O$, and then dried over $MgSO_4$ and freed of solvent on a rotary evaporator. The resulting solid was crystallized from low-boiling ligroin via a Soxhlet extractor. Fluffy white crystals, m.p. 65°–67° C. Yield 31.8 g. Elemental Analysis: $C_{27}H_{30}O_7$, mol. wt. 466.5. Anal. Calcd: C, 69.5; H, 6.5, O, 24.0. Found: C, 69.5; H, 6.5; $^1H$ NMR ($CDCl_3$): δ (ppm) 4.4 (4H, m).

Step 5

Preparation of Poly{6-[4-(4-Methoxycinnamoyloxy)benzoyl]hexyl Methacrylate} (Polymer 1, Table I)

This polymer was prepared from the monomer of Step 4 by dissolving in ethyl ether and initiating polymerization with 0.5 to 1.0% by weight of 2,2'-azobis(2-methylpropionitrile). The solutions were placed in polymerization vials, septa sealed and purged with $N_2$ for 20 minutes via syringe needles while cooling to eliminate evaporation. The flasks were then immersed in constant temperature baths at the prescribed temperatures for 15 hours. The viscous solutions were diluted with their respective solvents and precipitated by adding dropwise into the ethyl ether solvents with vigorous stirring. Solids were collected by vacuum filtration and dried under oil pump vacuum.

Representative polymers of this invention are presented in Table I. The structure of all polymers were confirmed by elemental analysis and UV spectroscopy. Absolute molecular weights are determined by known light scattering techniques.

Liquid crystallinity of the polymers was confirmed by examination of polymer melts under a hot stage polarizing microscope. Under X polarizers typical nematic, cholesteric or smectic liquid crystalline textures were observed.

TABLE I

| Polymer No. | Structure | I.V. | Absolute Molecular Weight |
|---|---|---|---|
| 1A | $\text{—(CH}_2\text{—C(CH}_3\text{)—)—C(=O)—O—(CH}_2)_6\text{—O—C(=O)—C}_6\text{H}_4\text{—O—C(=O)—CH=CH—C}_6\text{H}_4\text{—OCH}_3$ | 0.31 | 213,000 |
| 1B | $\text{—(CH}_2\text{—C(CH}_3\text{)—)—C(=O)—O—(CH}_2)_6\text{—O—C(=O)—C}_6\text{H}_4\text{—O—C(=O)—CH=CH—C}_6\text{H}_4\text{—OCH}_3$ | 0.46 | 402,000 |
| 1C | $\text{—(CH}_2\text{—C(CH}_3\text{)—)—C(=O)—O—(CH}_2)_6\text{—O—C(=O)—C}_6\text{H}_4\text{—O—C(=O)—CH=CH—C}_6\text{H}_4\text{—OCH}_3$ | 0.79 | 821,000 |

TABLE I-continued
| Polymer No. | Structure | I.V. | Absolute Molecular Weight |
|---|---|---|---|
| 1D | 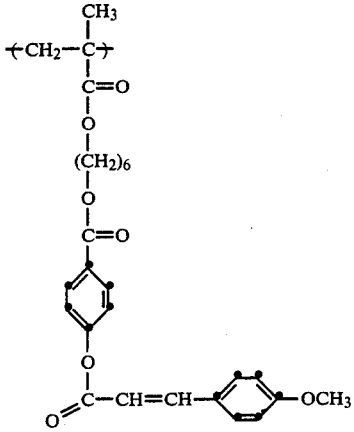 | 0.84 | 1,170,000 |
| 1E | 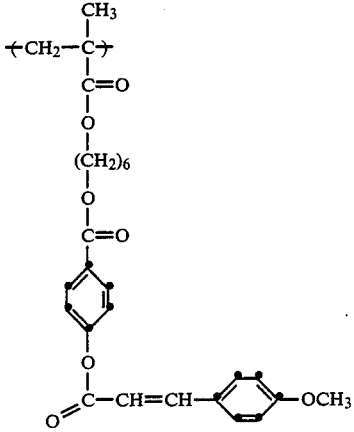 | 1.61 | 1,760,000 |
| 2 | 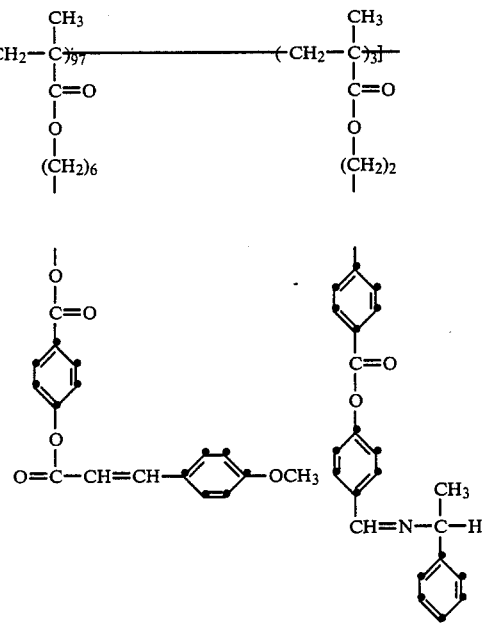 | 0.35 | |

TABLE I-continued

| Polymer No. | Structure | I.V. | Absolute Molecular Weight |
|---|---|---|---|
| 3 | 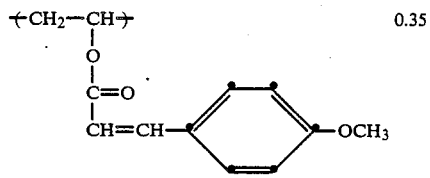 | 0.21 | |

PHOTOGRAPHIC EVALUATION

The polymer of the Example 1, Step 5 was made to several different molecular weights for photographic speed evaluation. These polymers are indicated in Table I as polymers 1A through 1E.

A poly(vinyl alcohol-co-vinyl benzoate-co-vinyl 4-methoxycinnamate) copolymer (mole ratio 10/55/35) was prepared as a first control (Control 1) (PVA control). This polymer is frequently used in photoresist applications. It has no spacer groups or groups to stiffen the cinnamoyl group. It has the structure:

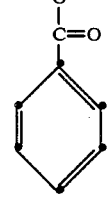

The above control polymer was prepared by the following procedure:

p-Methoxycinnamic acid (14.2 gm, $7.95 \times 10^{-2}$ m) was treated with a 20 fold excess of oxalyl chloride. A drop of DMF was added. After the evolution of HCl gas had subsided, the solution was heated to reflux for 1 hour. The oxalyl chloride was evaporated off and an oil was isolated. This acid chloride of p-methoxycinnamic acid weighed 15.63 gm ($2.27 \times 10^{-1}$M).

Poly(vinyl alcohol) (PVA) (10 gm, $2.27 \times 10^{-1}$M) (100% hydroxylzed—abs. mw=75,000) was put in 100 ml of dry pyridine and stirred at 70° C. overnight. 19.33 g of benzoyl chloride (0.137 m 10% excess) was added and the reaction was allowed to stir for 4 hrs. Next, the p-methoxycinnamoyl chloride was added and the reaction was stirred overnight. The cooled solution was then precipitated into methanol. The isolated polymer was put in 1,2-dichloromethane and reprecipitated into methanol. This was repeated twice. Yield 24.4 g IV.-1.15.

The molecular weight of this control polymer could not be determined by Gel Permeation Chromatography or light scattering. However, it is known that the degree of polymerization of the backbone is 1700 which makes the absolute molecular weight approximately 268,000.

Coating formulations of the polymers to be evaluated and a coumarin sensitizer were prepared with the following composition and cast as films on aluminum supports.

Two different molecular weight versions of poly[2-(4-methoxycinnamoyloxy)ethyl methacrylate-co-methyl methacrylate] (mole ratio 35/659 were prepared as Controls A and B to show that a short spacer group having less than four carbon atoms between the polymer backbone and the methoxy cinnamate group was not sufficient to significantly improve photographic speed or result in liquid crystallinity of these polymers. This polymer has the structure:

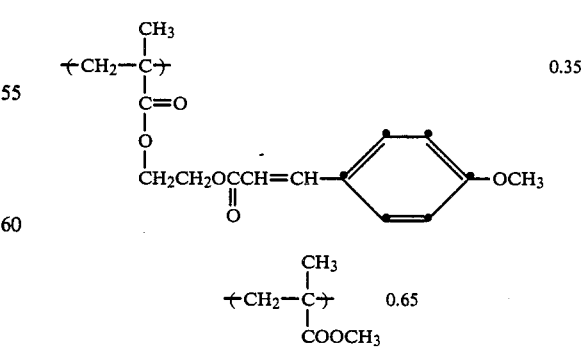

All polymers evaluated were dissolved in cyclohexanone at 3 percent by weight. The light-sensitive cinnamoyl components of each polymer were adjusted to 2.1 molar. The coumarin sensitizer was KC-74*. Its concentration was adjusted to $3 \times 10^{-1}$ molar in the solution.

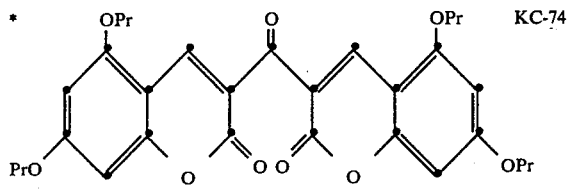

The thus formed coating formulations were coated on aluminum supports. Each coating was the same optical density. Each film was then exposed on an optical bench with a PEK 200 watt super high pressure mercury light source. The appropriate filters were used ($\lambda \geq 405$ nm) to insure that only the sensitizer absorbed the incident radiation. The films were irradiated through a photographic step tablet in which the density varies in increments of 0.15 per step. After irradiation, the films were developed by soaking in cyclohexanone for 1 minute or until no further change was noted.

Table II shows the molecular weights and the relative photographic speed results of the amorphous controls and various molecular weight versions of Polymer 1, Table I of the invention. The difference in the photographic speed between PVA control and Control B could be attributed to the difference in the backbone configuration and the effect the backbone has on the orientation of the cinnamate component. Also, the —$C_2H_4$— spacer removes some of the orientational influence the polymeric backbone might exert on the cinnamate component. The latter effect most certainly would increase the photographic speed of the polymer. The effect that the molecular weight played on the photographic speed of light-sensitive polymers is best illustrated by comparing control polymers (A) and (B) in Table II.

It was necessary to handle films of Polymers 1C, 1E and 1D under safe-light conditions to avoid premature fogging. Polymer 1E has a molecular weight $6\times$ that of the PVA cinnamate control, but was $83\times$ faster. The molecular weight difference certainly accounted for some of this increased speed but obviously could not account for all of it. This data shows that the liquid crystalline polymers of this invention present the necessary ordered state to dramatically increase the photographic speed of photocrosslinkable polymers.

TABLE II

Photographic Sensitivity of the Amorphous-Cinnamate Polymers

| Polymer | I.V.[d] | P.S.E.W.[a] Mw | Mn | ABS.[b] Mw | Relative Photo Speed[c] |
|---|---|---|---|---|---|
| (PVA-control) | 1.12 | — | — | 268,000 | 1.0 |
| Control A | 0.31 | 51,074 | 21,946 | 70,700 | 0.25 |
| Control B | 0.90 | 299,606 | 76,029 | 455,000 | 2.6 |
| Polymer 1, | | | | | |
| Table 1A | 0.31 | 85,000 | 34,800 | 213,000 | 5.6 |
| 1B | 0.46 | 164,000 | 59,800 | 402,000 | 13.5 |
| 1C | 0.79 | 368,000 | 94,600 | 821,000 | 25 |
| 1D | 0.84 | 428,000 | 140,900 | 1,170,000 | 33.3 |
| 1E | 1.61 | 883,700 | 333,636 | 1,760,000 | 83.3 |

[a]Polystyrene equivalent weights determined by gel permeation chromatography.
[b]Absolute molecular weights determined by light scattering.
[c]Exposure time/exposure time of control.
[d]Inherent viscosity determined at a conc. of 0.5 g/dL in 1:1 phenolchlorobenzene.

The invention has been described in detail with particular reference to preferred embodiments thereof, but it will be understood that variations and modifications can be effected within the spirit and scope of the invention.

We claim:

1. A photocrosslinkable liquid crystalline polymer comprising a vinyl backbone having from 60 to 100 mole percent of recurring pendant groups comprising an alkyl or alkoxy light-sensitive cinnamate component connected to the vinyl backbone through (a) a component which provides stiffness and rod-like character to the cinnamate component and (b) a spacer group having a backbone of from 7 to 14 atoms.

2. The polymer of claim 1 having the structure:

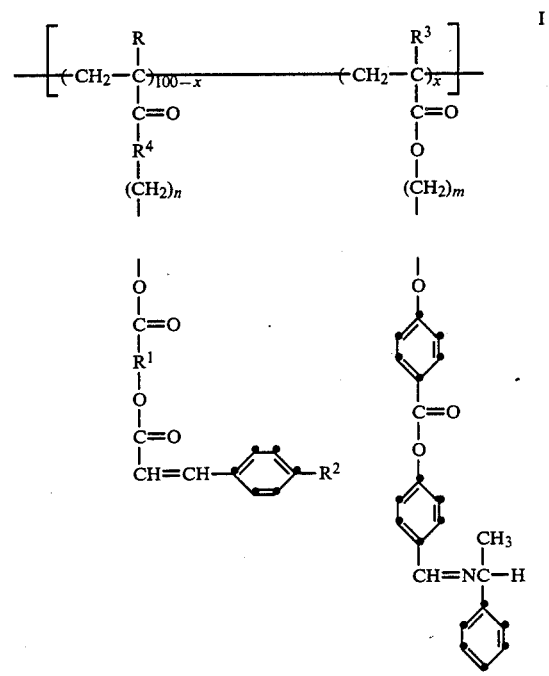

wherein n represents an integer of from 3 to 10;

m represents an integer of from 2 to 6;

x has a value of 0 to 35 mole percent;

R and $R^3$ each independently represents hydrogen or methyl;

$R^1$ represents phenylene, biphenylene, terphenylene, 1,1-binaphthyl-4,4'-ylene, phenyleneoxycarbonylphenylene, azodiphenylene-N-oxide, naphthylene, stilbene-4,4'-diyl or $\alpha$-azastilbene-4,4'-diyl;

$R^2$ represents alkyl or alkoxy; and $R^4$ represents —O— or —NH—.

3. The polymer of claim 2 wherein

R and $R^3$ represents methyl;

x is 0 to 5 mole percent;

n is 5 to 6;

m is 2 to 6;

$R^1$ represents phenylene; and $R^2$ represents alkyl such as methyl, ethyl, propyl, butyl, 2-ethyl hexyl and octyl; or alkoxy such as methoxy, ethoxy, propoxy, butoxy and octyloxy.

4. The polymer of claim 2 or 3 wherein x is zero.

5. The polymer of claim 2 selected from the group consisting of

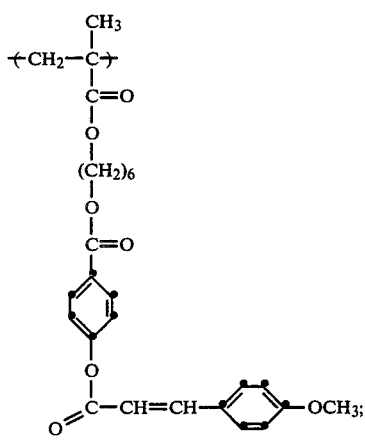

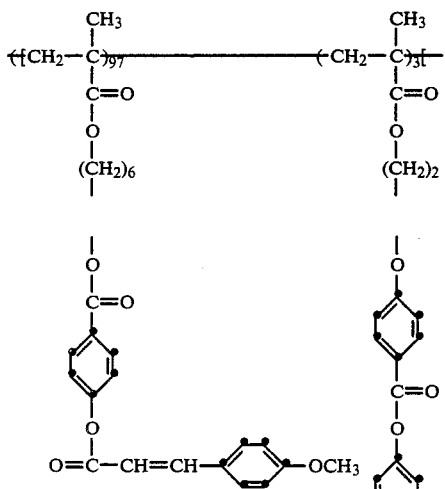

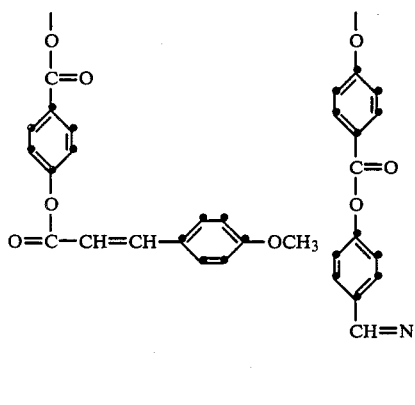

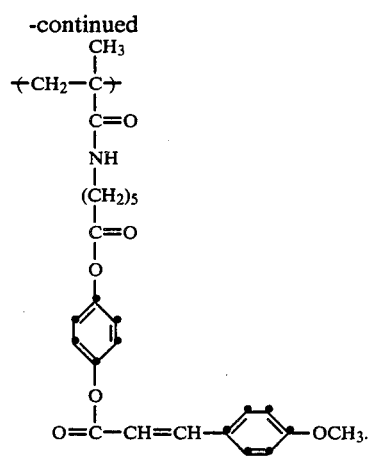

6. A method of making a photocrosslinkable liquid crystalline polymer comprising the steps of:
preparing an acrylate compound having the structure

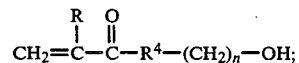

preparing a light-sensitive compound having the structure

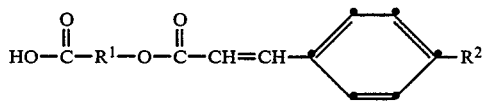

or its acid chloride;
reacting the acrylate compound and the light-sensitive compound together to form a monomer having the structure

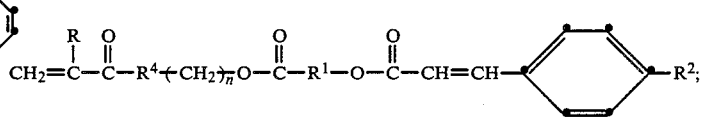

and
polymerizing the monomer to form the light-sensitive acrylate liquid crystalline polymer;
wherein
R represents hydrogen or methyl;
$R^1$ represents phenylene, biphenylylene, terphenylylene, 1,1'-binaphthyl-4,4'-ylene, phenyleneoxycarbonylphenylene, azodiphenylene-N-oxide, naphthylene, stilbene-4,4'-diyl or α-azastilbene-4,4'-diyl;
$R^2$ represents an alkyl or alkoxy group;
$R^4$ represents —O— or —NH—; and
n represents an integer of from 3 to 10.

7. An imaging element comprising a support bearing a layer containing a sensitizer and photocrosslinkable liquid crystalline polymer according to claim 1, 2, 3, 4 or 5.

* * * * *

UNITED STATES PATENT OFFICE
CERTIFICATE OF CORRECTION

PATENT NO. : 4,696,990
DATED : September 29, 1987
INVENTOR(S) : John M. Noonan et al.

It is certified that error appears in the above-identified patent and that said Letters Patent are hereby corrected as shown below:

Column 15, line 21 the part of the structure reading

" 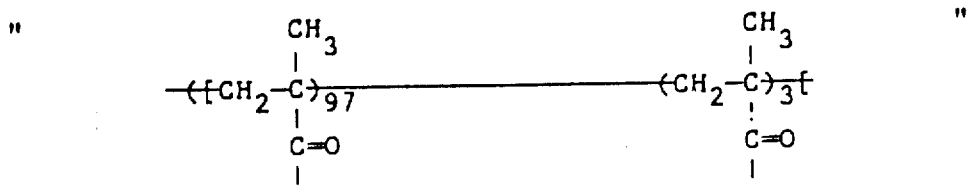 "

should read

--  --

Signed and Sealed this

Twenty-second Day of March, 1988

Attest:

DONALD J. QUIGG

Attesting Officer

Commissioner of Patents and Trademarks